United States Patent
Jing

(10) Patent No.: US 11,195,890 B2
(45) Date of Patent: Dec. 7, 2021

(54) DISPLAY PANEL COMPRISING GATE METAL LAYER ELECTRICALLY CONNECTED TO METAL CONNECTION REGION VIA THROUGH HOLE AND METHOD OF MANUFACTURING SAME

(71) Applicant: HUIZHOU CHINA STAR OPTOELECTRONICS TECHNOLOGY CO., LTD., Huizhou (CN)

(72) Inventor: Xiaohong Jing, Huizhou (CN)

( * ) Notice: Subject to any disclaimer, the term of this patent is extended or adjusted under 35 U.S.C. 154(b) by 192 days.

(21) Appl. No.: 16/618,373

(22) PCT Filed: Oct. 30, 2019

(86) PCT No.: PCT/CN2019/114177
§ 371 (c)(1),
(2) Date: Dec. 1, 2019

(87) PCT Pub. No.: WO2020/244133
PCT Pub. Date: Dec. 10, 2020

(65) Prior Publication Data
US 2021/0335925 A1    Oct. 28, 2021

(30) Foreign Application Priority Data
Jun. 6, 2019   (CN) .......................... 201910492321.0

(51) Int. Cl.
*H01L 29/08*    (2006.01)
*H01L 27/32*    (2006.01)
(Continued)

(52) U.S. Cl.
CPC ........ *H01L 27/3244* (2013.01); *G02F 1/1368* (2013.01); *H01L 51/0097* (2013.01); *H01L 51/56* (2013.01)

(58) Field of Classification Search
CPC .................................................. H01L 27/3244
See application file for complete search history.

(56) References Cited

U.S. PATENT DOCUMENTS 6,201,346 B1 *   3/2001   Kusaka ............... H01L 27/3288
                                                            313/504
7,342,354 B2 *   3/2008   Utsunomiya ....... H01L 27/1214
                                                            313/503
(Continued)

FOREIGN PATENT DOCUMENTS

| CN | 104851892 A | 8/2015 |
| CN | 108511487 A | 9/2018 |
| CN | 109728028 A | 5/2019 |

*Primary Examiner* — Caleb E Henry

(57) ABSTRACT

A display panel and a method of manufacturing the same are provided. The display panel includes a flexible substrate, a thin film transistor layer disposed on a side surface of the flexible substrate, and a light emitting structure disposed on the thin film transistor layer and electrically connected to the thin film transistor layer. The thin film transistor layer has at least one metal connection region disposed on a surface of the thin film transistor layer adjacent to the flexible substrate, and a metal trace of the thin film transistor layer is electrically connected to the at least one metal connection region via a through hole. The flexible substrate has at least one opening disposed corresponding to the at least one metal connection region to expose the at least one metal connection region.

8 Claims, 2 Drawing Sheets

(51) Int. Cl.
   *H01L 51/56*  (2006.01)
   *G02F 1/1368* (2006.01)
   *H01L 51/00*  (2006.01)

(56) References Cited

U.S. PATENT DOCUMENTS

| | | | |
|---|---|---|---|
| 9,952,626 B2 * | 4/2018 | Jinbo | G06F 1/1601 |
| 10,580,846 B2 * | 3/2020 | Seo | H01L 51/0097 |
| 2012/0140424 A1 * | 6/2012 | Sato | G02F 1/133305 |
| | | | 361/749 |
| 2012/0206680 A1 * | 8/2012 | Onishi | G02F 1/136204 |
| | | | 349/122 |
| 2013/0050126 A1 * | 2/2013 | Kimura | G06F 3/0445 |
| | | | 345/173 |
| 2013/0107476 A1 * | 5/2013 | Wright | H05K 1/115 |
| | | | 361/752 |
| 2013/0265256 A1 * | 10/2013 | Nathan | G06F 3/04144 |
| | | | 345/173 |
| 2014/0375916 A1 * | 12/2014 | Chen | H01L 27/1218 |
| | | | 349/33 |
| 2016/0307982 A1 * | 10/2016 | Hatano | H01L 27/3262 |
| 2016/0329386 A1 | 11/2016 | Sauers et al. | |
| 2017/0365652 A1 | 12/2017 | Li | |
| 2020/0176547 A1 | 6/2020 | Seo et al. | |

\* cited by examiner

DISPLAY PANEL COMPRISING GATE METAL LAYER ELECTRICALLY CONNECTED TO METAL CONNECTION REGION VIA THROUGH HOLE AND METHOD OF MANUFACTURING SAME

FIELD OF INVENTION

The present disclosure relates to the field of electronic display technologies, and more particularly to a display panel and a method of manufacturing the same.

BACKGROUND OF INVENTION

Current display panels generally include a display area and a non-display area, and the non-display area is disposed around the display area for setting an interface connected to a control chip and a connection circuit. In order to achieve a full screen, it is necessary to reduce an area of the non-display area.

At present, commonly used methods are to prepare a thin film transistor layer in a display panel using a flexible substrate. A non-display area is bent to a back of the display panel by a bendable flexible panel, which effectively reduces an area of the non-display area. However, this method cannot fully eliminate the area of the non-display area and cannot achieve a true full screen.

SUMMARY OF INVENTION

The present application provides a display panel and a method of manufacturing the same, which can realize a full screen with a screen ratio close to 100%.

To solve the above issues, an embodiment of the present application provides a display panel. The display panel includes a flexible substrate, a thin film transistor layer disposed on a side surface of the flexible substrate, and a light emitting structure disposed on the thin film transistor layer and electrically connected to the thin film transistor layer. The thin film transistor layer has at least one metal connection region disposed on a surface of the thin film transistor layer adjacent to the flexible substrate, and a metal trace of the thin film transistor layer is electrically connected to the at least one metal connection region via a through hole. The flexible substrate has at least one opening disposed corresponding to the at least one metal connection region to expose the at least one metal connection region.

In an embodiment of the present disclosure, the display panel further includes at least one control chip disposed on a surface of the flexible substrate facing away from the thin film transistor layer and electrically connected to the thin film transistor layer via the at least one metal connection region.

In an embodiment of the present disclosure, the thin film transistor layer includes a buffer layer disposed on the flexible substrate and covering the at least one metal connection region; a plurality of active regions independently disposed with each other, wherein each of the plurality of active regions comprises a channel region and a source/drain region disposed on both sides of the channel region; a gate dielectric layer covering the plurality of active regions; a gate metal layer disposed above the gate dielectric layer and disposed corresponding to the plurality of active regions; an interlayer dielectric layer covering the plurality of active regions and the gate metal layer; and a source/drain metal layer disposed above the interlayer dielectric layer.

In an embodiment of the present disclosure, the at least one metal connection region includes a first metal connection region and a second metal connection region.

In an embodiment of the present disclosure, the gate metal layer is electrically connected to the first metal connection region via a first through hole.

In an embodiment of the present disclosure, the source/drain metal layer is electrically connected to the second metal connection region via a second through hole.

In an embodiment of the present disclosure, the display panel further includes at least one flexible circuit board, an end of each of the at least one flexible circuit board is connected to the at least one metal connection region, another end of each of the at least one flexible circuit board is connected to the at least one control chip.

In an embodiment of the present disclosure, the display panel is a liquid crystal display panel.

In an embodiment of the present disclosure, the display panel is an organic self-luminous diode display panel.

An embodiment of the present disclosure further provides a method of manufacturing a display panel. The method includes providing a flexible substrate; forming a thin film transistor layer on a side surface of the flexible substrate, wherein the thin film transistor layer has at least one metal connection region disposed on a surface of the thin film transistor layer adjacent to the flexible substrate, and a metal trace of the thin film transistor layer is electrically connected to the at least one metal connection region via a through hole; forming a light emitting structure, wherein the light emitting structure is disposed on the thin film transistor layer and electrically connected to the thin film transistor layer; forming at least one opening on the flexible substrate, wherein the at least one opening is disposed corresponding to the at least one metal connection region to expose the at least one metal connection region; and providing at least one control chip is provided, wherein the at least one control chip is disposed on a surface of the flexible substrate facing away from the thin film transistor layer and electrically connected to the thin film transistor layer via the at least one metal connection region.

In an embodiment of the present disclosure, the at least one metal connection region includes a first metal connection region and a second metal connection region.

In an embodiment of the present disclosure, forming the thin film transistor layer includes forming a buffer layer disposed on the flexible substrate and covering the at least one metal connection region; forming a plurality of active regions independently disposed with each other, wherein each of the plurality of active regions comprises a channel region and a source/drain region disposed on both sides of the channel region; forming a gate dielectric layer covering the plurality of active regions; forming a gate metal layer disposed above the gate dielectric layer and disposed corresponding to the plurality of active regions, wherein the gate metal layer is electrically connected to the first metal connection region via a first through hole; forming an interlayer dielectric layer covering the plurality of active regions and the gate metal layer; and forming a source/drain metal layer disposed above the interlayer dielectric layer.

Beneficial effects of an embodiment of the present application are that, the display panel provided by the embodiment of the present application adopts the flexible substrate, and a plurality of metal connection regions are disposed between the thin film transistor layer and the flexible substrate. The metal trace of the thin film transistor layer is electrically connected to the plurality of metal connection regions via the through hole. In such an arrangement, the interface connecting the display panel and the control chip, and the connection circuit are disposed on a back surface of the flexible substrate, and the area of the non-display area can be reduced to zero without occupying an area of a light-emitting surface of the display panel. Therefore, the embodiment of the present application can achieve a full screen with a screen ratio close to 100%.

DETAILED DESCRIPTION OF PREFERRED EMBODIMENTS

Figure 1:
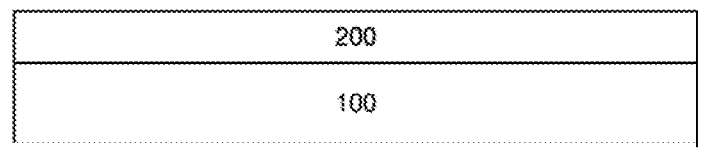
FIG. 1 is a schematic structural view of a display panel after forming a flexible substrate in a specific embodiment of the present application.

The following description of the various embodiments is provided to illustrate the specific embodiments by referring to the accompanying drawings. Directional terms described by the present disclosure, such as top, bottom, front, back, left, right, inner, outer, side, etc., are only directions by referring to the accompanying drawings, and thus the used terms are used only for the purpose of describing embodiments of the present disclosure and are not intended to be limiting of the present disclosure. In the drawings, units with similar structures are labeled with the same reference number.

Figure 2:
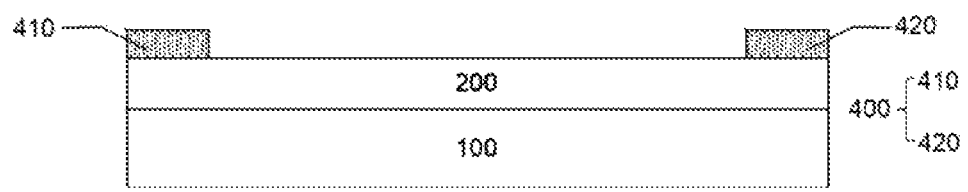
FIG. 2 is a schematic structural view of a display panel after forming at least one metal connection region in a specific embodiment of the present application.
Figure 4:
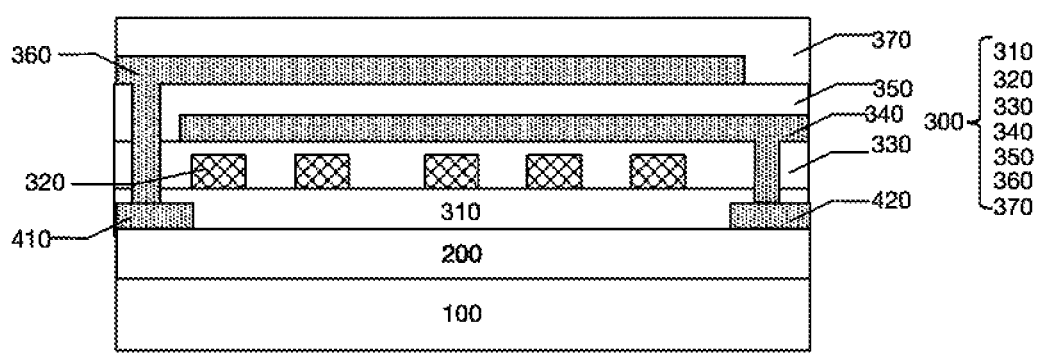
FIG. 4 is a schematic structural view of a display panel after forming a planarization layer in a specific embodiment of the present application.
Figure 7:
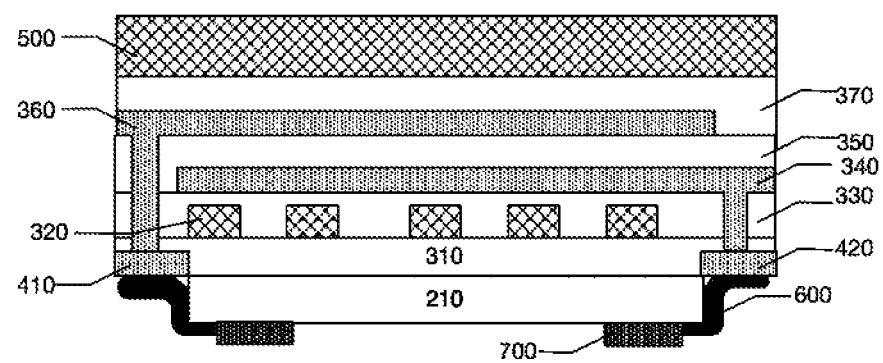
FIG. 7 is a schematic structural view of a display panel connected to a control chip in a specific embodiment of the present application.

In order to solve the above issues, an embodiment of the present application provides a display panel. Referring to FIG. 2, FIG. 4, and FIG. 7, FIG. 2 is a schematic structural view of a display panel after forming at least one metal connection region in a specific embodiment of the present application, FIG. 4 is a schematic structural view of a display panel after forming a planarization layer in a specific embodiment of the present application, and FIG. 7 is a schematic structural view of a display panel connected to a control chip in a specific embodiment of the present application.

In an embodiment of the present application, the display panel may be a liquid crystal display panel or an organic self-luminous diode display panel, and any of the display panels may adopt the technical solution of the present invention. In the present embodiment, an organic self-luminous diode display panel will be described as an example. The display panel includes a flexible substrate 200, a thin film transistor layer 300, and a light emitting structure 500.

The thin film transistor layer 300 is disposed on a side surface of the flexible substrate 200. The light emitting structure 500 is disposed on the thin film transistor layer 300 and is electrically connected to the thin film transistor layer 300. Referring to FIG. 4, the thin film transistor layer 300 has at least one metal connection region 400, and the at least one metal connection region 400 is disposed on a surface of the thin film transistor layer 300 adjacent to the flexible substrate 200. A metal trace of the thin film transistor layer 300 is electrically connected to the at least one metal connection region 400 via a through hole.

Referring to FIG. 7, the flexible substrate 200 has at least one opening that is disposed corresponding to the at least one metal connection region 400 to expose the at least one metal connection region 400.

In this embodiment, the display panel further includes at least one control chip 700. The at least one control chip 700 is disposed on a surface of the flexible substrate 200 facing away from the thin film transistor layer 300 and is electrically connected to the thin film transistor layer 300 via the at least one metal connection region 400.

In this embodiment, the thin film transistor layer 300 includes a buffer layer 310, a plurality of active regions 320 independently disposed with each other, a gate dielectric layer 330, a gate metal layer 340, an interlayer dielectric layer 350, a source/drain metal layer 360, and a planarization layer 370.

The buffer layer 310 is disposed on the flexible substrate 200 to cover the at least one metal connection region 400. Each of the active regions 320 includes a channel region and a source/drain region on both sides of the channel region. The gate dielectric layer 330 covers the plurality of active regions 320. The gate metal layer 340 is disposed above the gate dielectric layer 330 and is disposed corresponding to the plurality of active regions 320. The interlayer dielectric layer 350 covers the plurality of active regions 320 and the gate metal layer 340. The source/drain metal layer 360 is disposed above the interlayer dielectric layer 350.

In one embodiment of the present invention, the at least one metal connection region 400 includes a first metal connection region 410 and a second metal connection region 420. The gate metal layer 340 is electrically connected to the first metal region 410 via a first through hole. The source/drain metal layer 360 is electrically connected to the second metal connection region 420 via a second through hole. Alternatively, in an embodiment, as shown in FIG. 4, the gate metal layer 340 is electrically connected to the second metal connection region 420 via a first through hole. The source/drain metal layer 360 is electrically connected to the first metal connection region 410 via a second through hole. The at least one metal connection region and the metal layer of the thin film transistor may be connected as needed, and the connection relationship in the above embodiment is not to be construed as limiting the invention.

In this embodiment, the display panel further includes at least one flexible circuit board 600. An end of each of the flexible circuit boards 600 is connected to the metal connection region, and the other end thereof is connected to the control chip 700.

Correspondingly, an embodiment of the present invention also provides a method of manufacturing a display panel. The method includes the following steps.

First, referring to FIG. 1, a flexible substrate 200 is provided.

Figure 3:
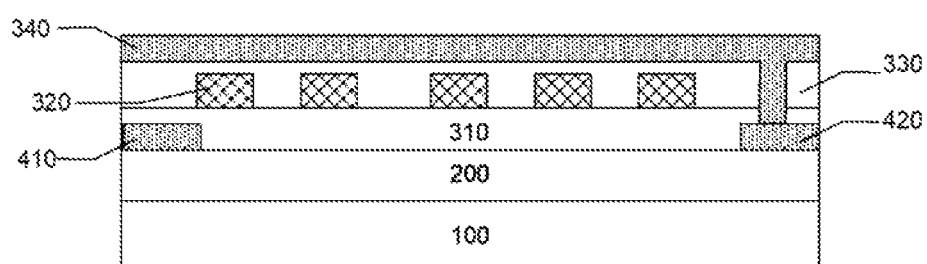
FIG. 3 is a schematic structural view of a display panel after forming a gate metal layer in a specific embodiment of the present application.

Thereafter, a thin film transistor layer 300 is formed with reference to FIGS. 2, 3, and 4. The thin film transistor layer 300 is disposed on a side surface of the flexible substrate 200. The thin film transistor layer 300 has at least one metal connection region 400 disposed on a surface of the thin film transistor layer 300 adjacent to the flexible substrate 200, and a metal trace of the thin film transistor layer 300 is electrically connected to the at least one metal connection region 400 via a through hole.

Figure 5:
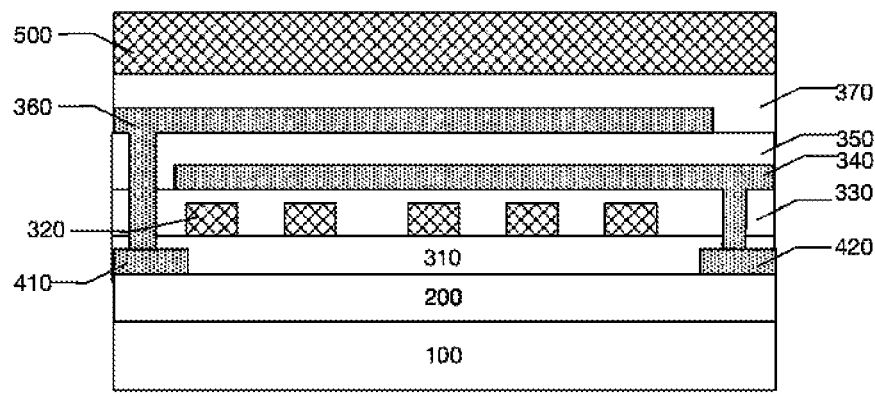
FIG. 5 is a schematic structural view of a display panel after forming a light emitting layer in a specific embodiment of the present application.

Thereafter, a light emitting structure 500 is formed with reference to FIG. 5. The light emitting structure 500 is disposed on the thin film transistor layer 300 and electrically connected to the thin film transistor layer 300.

Figure 6:
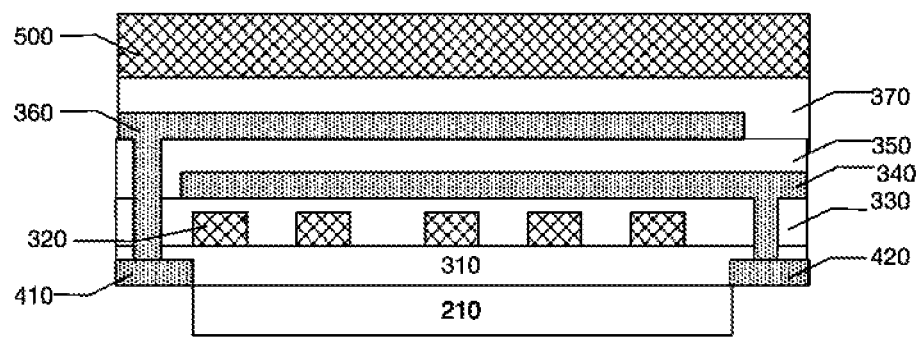
FIG. 6 is a schematic structural view of a display panel after forming at least one opening on a flexible substrate in a specific embodiment of the present application.

Thereafter, at least one opening is formed on the flexible substrate 200 with reference to FIG. 6. The at least one opening is disposed corresponding to the at least one metal connection region 400 to expose the at least one metal connection region 400.

Thereafter, at least one control chip 700 is provided with reference to FIG. 7. The at least one control chip 700 is disposed on a surface of the flexible substrate 200 facing away from the thin film transistor layer 300 and electrically connected to the thin film transistor layer 300 via the at least one metal connection region 400.

In an embodiment of the present disclosure, the at least one metal connection region 400 includes a first metal connection region 410 and a second metal connection region 420.

In an embodiment of the present disclosure, forming the thin film transistor layer includes the following.

Referring to FIG. 2, at least one metal connection region 400 is formed, which is disposed on a surface of the thin film transistor layer 300 adjacent to the flexible substrate 200.

Referring to FIG. 3, a buffer layer 310 is formed. The buffer layer 310 is disposed on the flexible substrate 200 and covering the at least one metal connection region 400. Then, a plurality of active regions 320 independently disposed with each other is formed. Each of the plurality of active regions 320 includes a channel region and a source/drain region disposed on both sides of the channel region. Then, a gate dielectric layer 330 covering the plurality of active regions is formed. Then, a gate metal layer 340 disposed above the gate dielectric layer 330 and disposed corresponding to the plurality of active regions 320 is formed. The gate metal layer 340 is electrically connected to the first metal connection region 410 via a first through hole.

Thereafter, an interlayer dielectric layer 350 covering the plurality of active regions 320 and the gate metal layer 340 is formed with reference to FIG. 4. A source/drain metal layer 360 is formed. The source/drain metal layer 360 is disposed above the interlayer dielectric layer 350. The source/drain metal layer 360 is electrically connected to the second metal connection region 420 via a second through hole.

Beneficial effects of an embodiment of the present application are that, the display panel provided by the embodiment of the present application adopts the flexible substrate, and a plurality of metal connection regions are disposed between the thin film transistor layer and the flexible substrate. The metal trace of the thin film transistor layer is electrically connected to the plurality of metal connection regions via the through hole. In such an arrangement, the interface connecting the display panel and the control chip, and the connection circuit are disposed on a back surface of the flexible substrate, and the area of the non-display area can be reduced to zero without occupying an area of a light-emitting surface of the display panel. Therefore, the embodiment of the present application can achieve a full screen with a screen ratio close to 100%.

In the above, the present invention has been disclosed in the above preferred embodiments, but the preferred embodiments are not intended to limit the present application. A person skilled in the art can make various modifications and refinements without departing from the spirit and scope of the present application. Therefore, the protection scope of the present application is defined by the claims.

What is claimed is:

1. A display panel, comprising:
    a flexible substrate;
    a thin film transistor layer disposed on a side surface of the flexible substrate;
    a light emitting structure disposed on the thin film transistor layer and electrically connected to the thin film transistor layer; and
    at least one control chip disposed on a surface of the flexible substrate facing away from the thin film transistor layer and electrically connected to the thin film transistor layer via the at least one metal connection region;
    wherein the thin film transistor layer has at least one metal connection region disposed on a surface of the thin film transistor layer adjacent to the flexible substrate, and a metal trace of the thin film transistor layer is electrically connected to the at least one metal connection region via a through hole; and
    wherein the flexible substrate has at least one opening disposed corresponding to the at least one metal connection region to expose the at least one metal connection region;
    wherein the thin film transistor layer comprises:
    a buffer layer disposed on the flexible substrate and covering the at least one metal connection region;
    a plurality of active regions independently disposed with each other, wherein each of the plurality of active regions comprises a channel region and a source/drain region disposed on both sides of the channel region;
    a gate dielectric layer covering the plurality of active regions;
    a gate metal layer disposed above the gate dielectric layer and disposed corresponding to the plurality of active regions;
    an interlayer dielectric layer covering the plurality of active regions and the gate metal layer; and
    a source/drain metal layer disposed above the interlayer dielectric layer;
    wherein the at least one metal connection region comprises a first metal connection region and a second metal connection region;
    wherein the gate metal layer is electrically connected to the first metal connection region via a first through hole.

2. The display panel according to claim 1, wherein the source/drain metal layer is electrically connected to the second metal connection region via a second through hole.

3. The display panel according to claim 1, further comprising at least one flexible circuit board, wherein an end of each of the at least one flexible circuit board is connected to the at least one metal connection region, another end of each of the at least one flexible circuit board is connected to the at least one control chip.

4. The display panel according to claim 1, wherein the display panel is a liquid crystal display panel.

5. The display panel according to claim 1, wherein the display panel is an organic self-luminous diode display panel.

6. A method of manufacturing a display panel, comprising:
provide a flexible substrate;
forming a thin film transistor layer on a side surface of the flexible substrate, wherein the thin film transistor layer has at least one metal connection region disposed on a surface of the thin film transistor layer adjacent to the flexible substrate, and a metal trace of the thin film transistor layer is electrically connected to the at least one metal connection region via a through hole;
forming a light emitting structure, wherein the light emitting structure is disposed on the thin film transistor layer and electrically connected to the thin film transistor layer;
forming at least one opening on the flexible substrate, wherein the at least one opening is disposed corresponding to the at least one metal connection region to expose the at least one metal connection region; and
providing at least one control chip is provided, wherein the at least one control chip is disposed on a surface of the flexible substrate facing away from the thin film transistor layer and electrically connected to the thin film transistor layer via the at least one metal connection region.

7. The method according to claim 6, wherein the at least one metal connection region comprises a first metal connection region and a second metal connection region.

8. The method to claim 7, wherein forming the thin film transistor layer comprises:
forming a buffer layer disposed on the flexible substrate and covering the at least one metal connection region;
forming a plurality of active regions independently disposed with each other, wherein each of the plurality of active regions comprises a channel region and a source/drain region disposed on both sides of the channel region;
forming a gate dielectric layer covering the plurality of active regions;
forming a gate metal layer disposed above the gate dielectric layer and disposed corresponding to the plurality of active regions, wherein the gate metal layer is electrically connected to the first metal connection region via a first through hole;
forming an interlayer dielectric layer covering the plurality of active regions and the gate metal layer; and
forming a source/drain metal layer disposed above the interlayer dielectric layer.

* * * * *